(12) United States Patent
Taunier et al.

(10) Patent No.: US 7,776,203 B2
(45) Date of Patent: Aug. 17, 2010

(54) METHOD OF PRODUCING THIN FILMS OF COMPOUND I-III-VI, PROMOTING THE INCORPORATION OF III ELEMENTS IN THE FILM

(75) Inventors: Stéphane Taunier, Paris (FR); Denis Guimard, Paris (FR); Daniel Lincot, Antony (FR); Jean-François Guillemoles, Paris (FR); Pierre-Philippe Grand, Charenton le Pont (FR)

(73) Assignees: Electricite de France, Paris (FR); Centre National de la Recherche Scientifique - CNRS, Paris (FR)

( * ) Notice: Subject to any disclaimer, the term of this patent is extended or adjusted under 35 U.S.C. 154(b) by 1420 days.

(21) Appl. No.: 10/540,729

(22) PCT Filed: Dec. 23, 2003

(86) PCT No.: PCT/FR03/03887

§ 371 (c)(1),
(2), (4) Date: Jun. 24, 2005

(87) PCT Pub. No.: WO2004/061924

PCT Pub. Date: Jul. 22, 2004

(65) Prior Publication Data

US 2006/0151331 A1     Jul. 13, 2006

(30) Foreign Application Priority Data

Dec. 26, 2002   (FR)  ................................. 02 16711

(51) Int. Cl.
*C25C 1/24*     (2006.01)

(52) U.S. Cl. ........................ 205/557; 205/239; 205/251; 205/549

(58) Field of Classification Search ......... 205/239–242, 205/251, 549, 557
See application file for complete search history.

(56) References Cited

U.S. PATENT DOCUMENTS

| | | | | | |
|---|---|---|---|---|---|
| 3,460,953 | A | * | 8/1969 | Schwartz | .................... 427/436 |
| 4,980,035 | A | * | 12/1990 | Emmenegger | .............. 205/238 |
| 5,275,714 | A | | 1/1994 | Bonnet et al. | |
| 5,534,128 | A | * | 7/1996 | Aso et al. | .................... 205/176 |
| 6,607,653 | B1 | * | 8/2003 | Tsuji et al. | .................. 205/241 |
| 2002/0189665 | A1 | | 12/2002 | Bhattacharya | |

FOREIGN PATENT DOCUMENTS

WO     WO 02/077322 A1     10/2002

OTHER PUBLICATIONS

International Search Report.
Paula Obreja et al.; "Preparation and Properties of Electrodeposited InSe and $Cu_xSe$ Thin Films"; Semiconductor Conference; 1998; pp. 233-236.

(Continued)

*Primary Examiner*—Arun S Phasge
(74) *Attorney, Agent, or Firm*—Kilpatrick Stockton LLP

(57) ABSTRACT

The invention relates to a method of producing thin films of compound CIGS by means of electrodeposition. According to the invention, a surface-active compound, such as dodecyl sodium sulphate, is added to an electrolysis bath solution in order to promote the incorporation of gallium in the CIGS films.

9 Claims, 2 Drawing Sheets

OTHER PUBLICATIONS

Fall et al.; "Electrochemical and Spectroscopic Properties of Poly(3-methoxythiophene) Electrosynthesized in an Aqueous Micellar Medium"; Abstract, Database Inspec 'Online!, The Institution of Electrical Engineers, Stevenage GB; XP002254320; Synthetic Metals, Elsevier, Switzerland, vol. 93, No. 3, Mar. 31, 1998; pp. 175-179; ISSN: 0379-6779.

* cited by examiner

METHOD OF PRODUCING THIN FILMS OF COMPOUND I-III-VI, PROMOTING THE INCORPORATION OF III ELEMENTS IN THE FILM

FIELD OF INVENTION

The present invention relates to the production of semiconductors of the I-III-VI$_2$ type in thin film form, especially for the design of solar cells.

BACKGROUND OF THE INVENTION

I-III-VI$_2$ compounds of the CuIn$_{(1-x)}$Ga$_x$Se$_y$S$_{(2-y)}$ type (where x is substantially between 0 and 1 and y is substantially between 0 and 2) are regarded as very promising and could constitute the next generation of thin-film photovoltaic cells. These compounds have a wide direct bandgap of between 1.05 and 1.6 eV, which allows solar radiation in the visible to be strongly absorbed.

Record photovoltaic conversion efficiencies have been achieved by preparing thin films by evaporation on small areas. However, evaporation is difficult to adapt to the industrial scale because of problems of nonuniformity and low utilization of raw materials. Sputtering is better suited to large areas, but it requires very expensive vacuum equipment and precursor targets.

There is therefore a real need for alternative, low-cost atmospheric-pressure, techniques. The technique of thin-film deposition by electrochemistry, in particular by electrolysis, appears to be a very attractive alternative. The advantages of this deposition technique are numerous, and in particular the following:

- deposition at ambient temperature and ambient pressure in an electrolysis bath;
- possibility of handling large areas with high uniformity;
- ease of implementation;
- low installation and raw material costs (no special forming operation, high level of material utilization); and
- great variety of possible deposit shapes due to the localized nature of the deposit on the substrate.

Despite extensive research in this field, the difficulties encountered relate to how to control the quality of the electrodeposited precursors (composition and morphology) and, more particularly, the difficulty of inserting metals such as gallium or aluminum (elements III) whose electrodeposition potential is very cathodic.

I-III-VI$_2$ compounds in which:
- the element I corresponds to Cu;
- the element III corresponds to In and to Ga and/or Al; and
- the element VI corresponds to Se and/or S, will be denoted hereafter by the abbreviation CIGS.

Moreover, the term "film" is understood to mean a thin layer deposited on a substrate, and the term "precursor film" is understood to mean a thin layer of overall composition close to I-III-VI$_2$ and obtained directly after deposition by electrolysis, with no optional subsequent treatment.

As regards pure electrodeposition of CIGS (with no evaporation step), the morphology and the composition of the precursors are very difficult to control, as the following documents indicate:

"One step electrodeposited CuIn$_{1-x}$Ga$_x$Se$_2$ thin films: structure and morphology", M. Fahourme, F. Chraibi, M. Aggour, J. L. Delplancke, A. Ennaoui and M. Lux-Steiner, 17th European Photovoltaic Solar Energy Conference, Oct. 22-26, 2001, Munich, Germany; and "CuIn$_{1-x}$Ga$_x$Se$_2$-based photovoltaic cells from electrodeposited precursor films", Materials Research Society Symposium—Proceedings, Volume 668, 2001, pages H8101-H8106, by R. N. Bhattacharya and Arturo M. Fernandes.

The most recent developments have involved an evaporation step after the electrodeposition, so as to increase the In and Ga contents of the electrodeposited films. In these developments, especially those described in document WO 01/78154, the electrodeposition is an actual codeposition of the elements Cu, In, Ga and Se (in order to obtain a quaternary alloy) and employs a method of deposition in a pH buffered electrolytic bath. The buffer solution is composed of sulfamic acid and potassium biphthalate, forming a buffer of the pHydrion (registered trademark) type. Electrodeposited films that have given photovoltaic cells using the hybrid method involving an electrodeposition step followed by an evaporation step have a dendritic morphology of low density.

OBJECTS OF THE INVENTION

The present invention aims to improve the situation.

For this purpose, it proposes a method of producing a I-III-VI$_y$ compound in thin film form, in which y is close to 2, by electrochemistry, comprising the following steps:
- an electrolysis bath comprising at least one element III dissolved in the bath and at least two electrodes immersed in the bath is provided, and
- a potential difference is applied between the two electrodes in order to initiate the formation of a thin film of I-III-VI$_y$ on the surface of one of the electrodes.

SUMMARY OF THE INVENTION

According to the invention, the electrolysis bath furthermore includes at least one surfactant compound in order to promote the incorporation of the element III into said film.

Advantageously, the element III comprises gallium and/or aluminum.

Preferably, the surfactant compound has a chemical formula CH$_3$(CH$_2$)$_n$O—SO$_3$—X, where n is greater than or equal to 5 and X is an atomic species such as H, Na, Li or K.

In a preferred embodiment, the surfactant compound comprises sodium dodecylsulfate.

Alternatively or additionally, the surfactant compound comprises 2-butyne-1,4-diol and/or maleic acid and/or succinic acid and/or fumaric acid and/or crotonic acid.

Preferably, the concentration of the surfactant in the electrolysis bath is substantially of the same order of magnitude as the concentration of gallium and/or aluminum.

BRIEF DESCRIPTION OF THE DRAWINGS

Other advantages and features of the invention will become apparent on reading the detailed description below of embodiments given by way of nonlimiting examples, and from examining the drawings which accompany it, in which:

Referring to FIG. 1, copper diselenide and indium-gallium (as element III) layers CO are obtained at ambient pressure and ambient temperature by the electrodeposition of a thin precursor film of suitable composition and morphology on a glass substrate S coated with molybdenum Mo.

Figure 1:
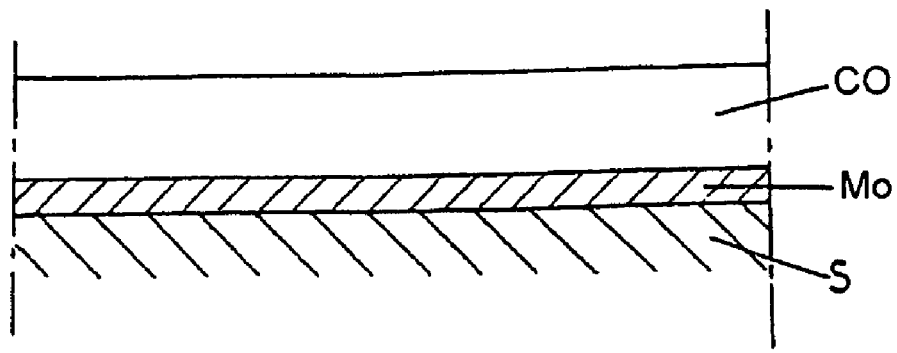
FIG. 1 shows schematically a thin film obtained by implementing the method according to the invention.
Figure 2:
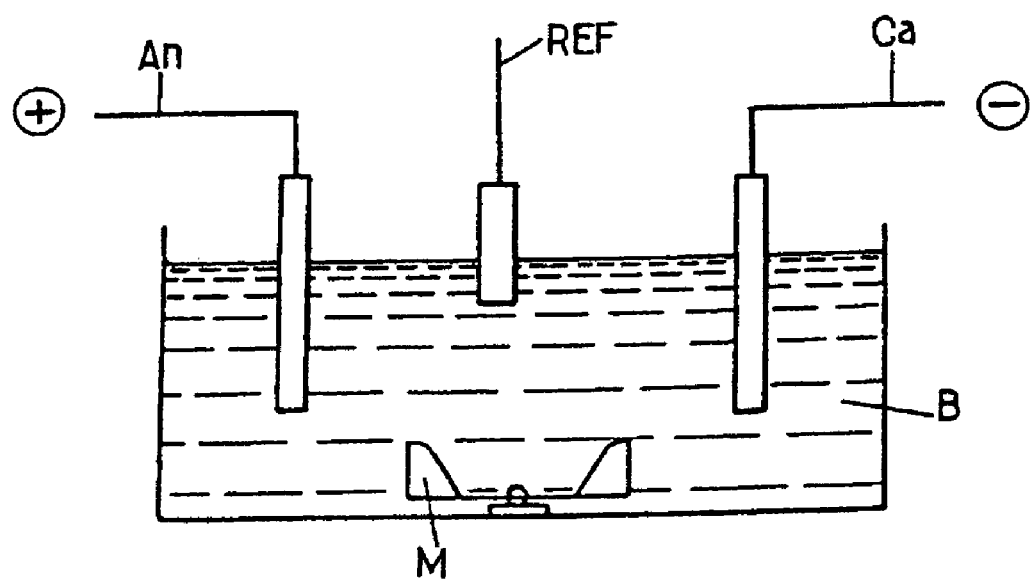
FIG. 2 shows schematically an electrolysis bath for implementing the method according to the invention.

The electrodeposition is carried out using an acid bath B (FIG. 2), stirred by blades M, containing an indium salt, a gallium salt, a copper salt and selenium oxide in solution. The concentrations of these precursor elements are between $10^{-4}$ and $10^{-2}$ M, where the symbol "M" corresponds to the unit "mole per liter". The pH of the solution is fixed between 1 and 4.

Three electrodes An, Ca and REF, including:
a molybdenum electrode Ca on which the thin film is formed by electrodeposition; and
a mercurous sulfate reference electrode REF, are immersed in the bath B.

The electrical potential difference applied to the molybdenum electrode is between $-0.8$ and $-1.4$ V relative to the reference electrode REF.

Films with a thickness of between 1 and 4 microns are obtained with current densities of between 0.5 and 10 mA/cm$^2$.

Under defined composition, solution stirring and potential difference conditions, it is possible to obtain dense adherent films of homogeneous morphology, the composition of which is close to the stoichiometric composition: Cu (25%); In+Ga (25+ε %) and Se (50%), with an (In+Ga)/Cu atomic ratio slightly greater than 1. It is thus possible to form deposits on areas of 10×10 cm$^2$.

DETAILED DESCRIPTION OF THE INVENTION

Figure 3:
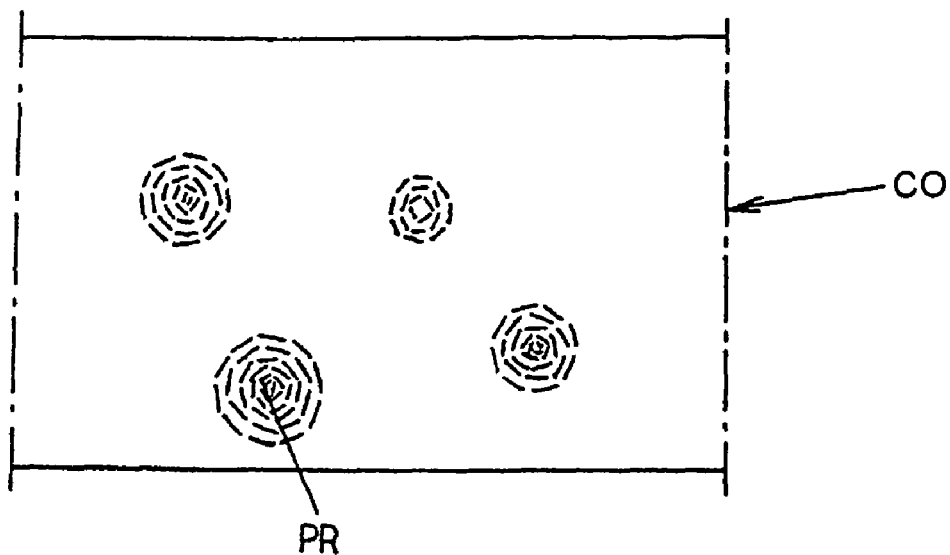
FIG. 3 shows schematically the appearance of a thin film of the prior art, seen from above.
Figure 4:
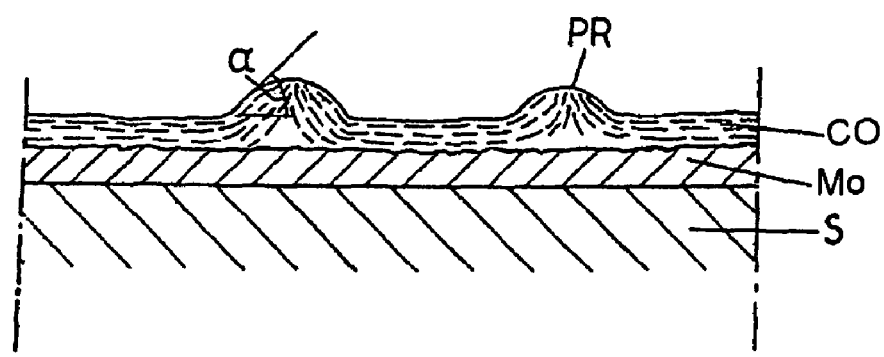
FIG. 4 shows schematically a sectional view of a thin film of the prior art, being formed.

However, the incorporation of gallium in order to form thin CGIS films often poses a problem, both from the standpoint of their morphology and their composition. Referring to FIG. 3, the precursor layers CO, being formed by electrolysis under conventional conditions, exhibit protuberances PR on the surface, these making a nonzero angle α relative to the principal plane of the surface of the layer (FIG. 4). Such a morphology of the thin film, which is particularly rough on its surface, is not compatible with the manufacture of photovoltaic cells, which require interfaces that are as parallel and as plane as possible in order to limit light loss and above all to avoid local short circuits (or shunts).

Furthermore, the volume composition of these deposits is lean in gallium (generally less than 5%) and in any case less than that initially desired.

The approach proposed in document WO 01/78154 consists in controlling the acidity of the electrolysis bath in order to ensure that its pH is stable and, consequently, to promote incorporation of gallium (an element whose deposition potential is very negative) into the CIGS layers being formed. For this purpose, the above document provides a buffer solution comprising sulfamic acid and potassium biphthalate in concentrations that are sufficient to ensure stability of the pH. $CuIn_{(1-x)}Ga_xSe_2$ films are then obtained with x close to 9%.

In another approach, the present invention proposes to add one or more surfactant additives to the electrolysis bath in order to form the CIGS films. $CuIn_{(1-x)}Ga_xSe_2$ films obtained by implementing the method according to the invention have a satisfactory morphology and a percentage x of gallium close to, or even greater than the aforementioned 9% value, as will be seen later with reference to a preferred embodiment.

One possible explanation of this improvement in the quality of the films by adding surfactants to the bath is the following. The addition of a surfactant compound, acting in the bath by being adsorbed on the electrode Ca on which the thin film forms, makes it possible to modify the surface tension at the interface between the thin film being formed and the solution of the bath. Thus, the activation energy for the reaction of incorporating the gallium combined with selenium into the thin film is lowered. The mixing of gallium with other elements, Cu, In and Se, therefore makes it possible to obtain a homogeneous morphology of the film, and a composition rich in gallium.

Another possible explanation, in addition to the above one, is that the surfactants used may furthermore play an inhibiting role in the hydrogen evolution reaction usually observed in electrolysis. This would allow more cathodic potentials to be applied, thus promoting the incorporation of gallium.

A leveling effect of the surfactants added may also be noted, allowing the surface of the film being formed to be made plane.

Thus, according to the invention, one or more surfactant additives, for improving the morphology and/or changing the relative ratios of the various electrodeposited elements (Cu—In—Ga—Se), are added to the solution. It will be understood that their main role is to help in the insertion of gallium into the precursor layers. The amount of gallium that can be inserted into the films may vary from 0 to 30% (in atomic percentage). The concentration of the additives may vary from $10^{-5}$ to $10^{-2}$ M.

Given below are various embodiments of the invention, with the following as surfactant additives:
sodium dodecylsulfate;
2-butyne-1,4-diol;
succinic acid;
fumaric acid; and
maleic acid.

Preferred Embodiment

Sodium Dodecylsulfate

A typical deposit was produced from an acid bath whose concentrations of the precursor elements and of the surfactant $CH_3(CH_2)_{11}OSO_3Na$ were the following:
[$CuSO_4$]=4.5×10$^{-3}$ M;
[$In_2(SO_4)_3$]=2.5×10$^{-3}$ M;
[$Ga_2(SO_4)_3$]=2.5×10$^{-3}$ M;
[$H_2SeO_3$]=7.5×10$^{-3}$ M;
[$CH_3(CH_2)_{11}OSO_3Na$]=20×10$^{-3}$ M The precursors were deposited by a cathodic reaction for a fixed potential, namely $-1.1$ V relative to the electrode REF. The current density was $-5$ mA/cm$^2$.

TABLE I

Analysis of the composition of an electrodeposited CIGS film from a solution containing sodium dodecylsulfate.

| Element | at % |
| --- | --- |
| Cu | 20.70 |
| Ga | 10.27 |
| Se | 50.94 |
| In | 18.10 |

Advantageously, the morphology of the film was very homogeneous.

More generally, it may be indicated that the addition of surfactants of formula $CH_3(CH_2)_nO$—$SO_3$—X (where n is greater than or equal to 5 and X is an atomic species such as H, Na, Li or K) gave satisfactory results.

Second Embodiment

2-butyne-1,4-diol

A typical deposit was produced from an acid bath whose concentrations of precursor elements and of the surfactant HO—CH$_2$—C≡C—CH$_2$—OH were the following:
[CuSO$_4$]=4.5×10$^{-3}$ M;
[In$_2$(SO$_4$)$_3$]=2.5×10$^{-3}$ M;
[Ga$_2$(SO$_4$)$_3$]=2.5×10$^{-3}$ M;
[H$_2$SeO$_3$]=7.5×10$^{-3}$ M;
[HO—CH$_2$—C≡C—CH$_2$—OH]=20×10$^{-3}$ M.

The precursors were deposited by a cathodic reaction with a potential set at −1.1 V relative to the electrode REF. The current density was −5 mA/cm$^2$.

TABLE II analysis of the composition of a CIGS film electrodeposited from a solution containing 2-butyne-1,4-diol.

| Element | at % |
|---|---|
| Cu | 23.10 |
| Ga | 1.80 |
| Se | 53.50 |
| In | 21.54 |

The morphology of the film was not very homogeneous. However, no debonding of the film was observed.

Third Embodiment of the Invention

Maleic Acid

A typical deposit was produced from an acid bath whose concentrations of precursor elements and of the surfactant HO$_2$C—CH═CH—CO$_2$H were the following:
[CuSO$_4$]=4.5×10$^{-3}$ M,
[In$_2$(SO$_4$)$_3$]=2.5×10$^{-3}$ M,
[Ga$_2$(SO$_4$)$_3$]=2.5×10$^{-3}$ M,
[H$_2$SeO$_3$]=7.5×10$^{-3}$ M,
[HO$_2$C—CH═CH—CO$_2$H]=20×10$^{-3}$ M.

The precursors were deposited by a cathodic reaction for a potential set at −1.1 V relative to the electrode REF. The current density was −5 mA/cm$^2$.

TABLE III analysis of the composition of a CIGS film electrodeposited from a solution containing maleic acid.

| Element | at % |
|---|---|
| Cu | 23.32 |
| Ga | 3.10 |
| Se | 53.32 |
| In | 20.26 |

The morphology of the film was substantially homogeneous.

Fourth Embodiment

Succinic Acid

A typical deposit was produced from an acid bath whose concentrations of precursor elements and of the surfactant HO$_2$—CH$_2$—CH$_2$—CO$_2$H were the following:
[CuSO$_4$]=4.5×10$^{-3}$ M,
[In$_2$(SO$_4$)$_3$]=2.5×10$^{-3}$ M,
[Ga$_2$ (SO$_4$)$_3$]=2.5×10$^{-3}$ M,
[H$_2$SeO$_3$]=7.5×10$^{-3}$ M,
[HO$_2$—CH$_2$—CH$_2$—CO$_2$H]=20×10$^{-3}$ M.

The precursors were deposited by a cathodic reaction for a potential set at −1.1 V relative to the electrode REF. The current density was −5 mA/cm$^2$.

TABLE IV analysis of the composition of a CIGS film electrodeposited from a solution containing succinic acid.

| Element | at % |
|---|---|
| Cu | 23.69 |
| Ga | 3.99 |
| Se | 53.33 |
| In | 19.99 |

The morphology of the film was advantageously homogeneous.

Fifth Embodiment

Fumaric Acid

A typical deposit was produced from an acid bath whose concentrations of precursor elements and of the surfactant HO$_2$—CH—CH—CO$_2$H were the following:
[CuSO$_4$]=4.5×10$^{-3}$ M,
[In$_2$(SO$_4$)$_3$]=2.5×10$^{-3}$ M,
[Ga$_2$ (SO$_4$)$_3$]=2.5×10$^{-3}$ M,
[H$_2$SeO$_3$]=7.5×10$^{-3}$ M,
[HO$_2$—CH—CH—CO$_2$H]=20×10$^{-3}$ M.

The precursors were deposited by a cathodic reaction for a potential set at −1.1 V relative to the electrode REF. The current density was −5 mA/cm$^2$.

TABLE V analysis of the composition of a CIGS film electrodeposited from a solution containing fumaric acid.

| Element | at % |
|---|---|
| Cu | 24.54 |
| Ga | 2.85 |
| Se | 52.60 |
| In | 20.00 |

The morphology of the film was substantially homogeneous.

More generally, the additive within the meaning of the invention may be a surfactant compound taken from the following two classes:
- the surfactant compounds, the molecule of which contains the X—SO$_3$—Y or Z—SO$_2$—Z' group, in which:
  - Y is an element taken from H, Na, Li, K;
  - X is an unsaturated (ethylenic, aromatic or acetylenic) group that may contain hetero atoms, with any number of carbon atoms, or else a saturated group that may contain hetero atoms;
  - Z and Z' are saturated or unsaturated groups that may contain hetero atoms (S, N or the like); and
- compounds whose molecule possesses at least one polar group: —OH—COOH, —S (or other hetero atom) and/or an unsaturated group: alkene, alkyne, aromatic (with or without a hetero atom), allowing the molecule to be adsorbed during electrodeposition.

Each compound of one of the two families may be used by itself or as a mixture. The same compound may belong to both families (if it possesses at least one unsaturated group and at least one $SO_2$ group).

It should be pointed out that these surfactant compounds differ from the usual organic solvents whose solvation role acts only on the solution of the bath. They also differ from the organic additives introduced into the electrolysis bath for stabilizing the pH.

The surfactant compounds described above may be easily used for any type of electrolysis bath for the electrodeposition of I-III-VI systems such as Cu—In—Ga—Al—Se—S.

The surfactants allowing gallium to be inserted into the precursor films thus make it possible to solve several difficulties described in the prior art (poor control of the morphology, of the composition of the precursors, in particular as regards the gallium content, and the difficulty of extending to large areas).

Of course, the present invention is not limited to the embodiment described above by way of example, rather it extends to other variants.

Thus, it will understood that aluminum, as element III, poses substantially the same problems of incorporation into the Cu—In—Al—Se films as gallium. In this regard, the invention applies also to the production of such films. Moreover, indium is usually introduced in excess into the solution of the bath in order to promote its incorporation into the film, indium combining, as element III, with selenium. It may be pointed out that the addition of surfactants to the bath ought also to promote the incorporation of indium as element III, into the film.

Moreover, it should also be pointed out that crotonic acid, as surfactant additive, has also provided satisfactory results.

The invention claimed is:

1. A method of producing a I-III-$VI_y$ compound in thin film form, in which y is close to 2, by electrochemistry, comprising:

a) providing an electrolysis bath comprising an element I compound, at least one element VI compound and at least one element III compound dissolved in the electrolysis bath and at least two electrodes immersed in the electrolysis bath; and, b) applying a potential difference between the two electrodes to initiate formation of a thin film of I-III-$VI_y$ on the surface of one of the electrodes, wherein the electrolysis bath further comprises at least one surfactant to promote incorporation of the element III compound into the film, and wherein the element I compound comprises copper, gold or silver, the at least one element III compound comprises boron, aluminum, gallium, indium or thallium and the at least one element VI compound comprises oxygen, sulfur, selenium, tellurium or polonium.

2. The method of claim 1, wherein the surfactant has a chemical formula $CH_3(CH_2)_nO—SO_3—X$, where n is greater than or equal to 5 and X is an atomic species selected from the group consisting of H, Na, Li and K.

3. The method of claim 2, wherein the surfactant comprises sodium dodecylsulfate.

4. The method of claim 1, wherein the surfactant comprises 2-butyne-1,4-diol.

5. The method of claim 1, wherein the surfactant comprises maleic acid.

6. The method of claim 1, wherein the surfactant comprises succinic acid.

7. The method of claim 1, wherein the surfactant comprises fumaric acid.

8. The method of claim 1, wherein the surfactant comprises crotonic acid.

9. The method of claim 1, wherein the surfactant in the electrolysis bath is in a concentration substantially of the same order of magnitude as a concentration of gallium or a concentration of aluminum in the electrolysis bath.

* * * * *